United States Patent
Sato et al.

(10) Patent No.: US 6,538,423 B1
(45) Date of Patent: Mar. 25, 2003

(54) COIL-TYPE METER

(75) Inventors: Koichi Sato, Niigata (JP); Numaya Hiroyasu, Niigata (JP); Koichi Jinushi, Niigata (JP); Yoshihiro Kamimura, Niigata (JP)

(73) Assignee: Nippon Seiki Co., Ltd., Niigata (JP)

( * ) Notice: Subject to any disclaimer, the term of this patent is extended or adjusted under 35 U.S.C. 154(b) by 0 days.

(21) Appl. No.: 09/786,730

(22) PCT Filed: Jul. 27, 2000

(86) PCT No.: PCT/JP00/05042

§ 371 (c)(1),
(2), (4) Date: Mar. 8, 2001

(87) PCT Pub. No.: WO01/09624

PCT Pub. Date: Feb. 8, 2001

(30) Foreign Application Priority Data

Jul. 30, 1999 (JP) .............................. 11-216195
Nov. 26, 1999 (JP) .............................. 11-335215

(51) Int. Cl.[7] .............................. G01R 1/20; G01R 1/16
(52) U.S. Cl. .............................. 324/146; 324/151 A
(58) Field of Search .............................. 324/144, 146, 324/147, 150, 151 R, 151 A, 152, 153, 154 R, 155; 74/409, 438, 439; 368/76

(56) References Cited

U.S. PATENT DOCUMENTS

| | | | |
|---|---|---|---|
| 383,444 A | * 5/1888 | Crompton et al. | .......... 324/146 |
| 2,446,579 A | * 8/1948 | Fritzinger | .................. 324/146 |
| 2,498,261 A | * 2/1950 | Fritzinger | ............... 324/140 D |
| 3,022,460 A | * 2/1962 | Schneider | .................... 310/77 |
| 4,492,920 A | * 1/1985 | Reenstra | ..................... 324/146 |
| 5,062,135 A | * 10/1991 | Ohike | ......................... 324/146 |
| 5,223,791 A | 6/1993 | Umehara | ................... 324/146 |
| 5,387,860 A | * 2/1995 | Tsai et al. | ................... 324/146 |
| 5,463,314 A | * 10/1995 | Mueller et al. | ............. 324/146 |
| 5,578,918 A | 11/1996 | Baatz | ......................... 324/146 |
| 6,124,774 A | * 9/2000 | Quelo | ......................... 310/152 |
| 6,294,907 B1 | * 9/2001 | Koumura et al. | ........... 324/146 |

FOREIGN PATENT DOCUMENTS

| | | |
|---|---|---|
| JP | 101927/1989 | 4/1991 |
| JP | 90197/1991 | 10/1992 |
| JP | 6-27146 | 2/1994 |
| JP | 8-15323 | 1/1996 |
| JP | 10-300787 | 11/1998 |

* cited by examiner

Primary Examiner—Edward Lefkowitz
Assistant Examiner—Darrell Kinder
(74) Attorney, Agent, or Firm—McDermott, Will & Emery

(57) ABSTRACT

Provided is a coil instrument which can maintain a compact configuration even when a rotary shaft at a pointer side is subjected to a deceleration rotation by way of gears. The coil instrument includes a rotor shaft having a rotor magnet and a first gear, a pointer shaft having a second gear connected with the first gear, a housing which pivotally supports the pointer shaft and the rotor shaft in parallel, and a pair of coils which are arranged such that coils opposedly face an outer peripheral surface of the rotor magnet where the second gear is not arranged and give a rotational force to the rotor magnet upon energization thereof.

19 Claims, 5 Drawing Sheets

COIL-TYPE METER

FIELD OF THE INVENTION

The present invention relates to a coil instrument which rotates a rotor magnet by energizing a coil, for example, a coil instrument incorporated in a combination meter for a vehicle.

BACKGROUND OF THE INVENTION

As a coil instrument applicable to a meter for vehicle, for example, a cross-coil instrument has been generally well known. The cross-coil instrument is called "an air core type movement" and is constituted such that a rotor magnet is accommodated in a space defined in a housing, a rotor shaft fixed to the rotor magnet is pivotally supported on the housing, one end of the rotor shaft is protruded to the outside of the housing, a pointer is mounted on a protruded end of the rotor shaft, and a pair of coils are wound around an outer periphery of the housing in such a manner that the coils cross at a right angle. The rotor magnet (pointer) is rotated due to a resultant magnetic field generated by energizing respective coils. By controlling energizing quantities (inputting signals) to respective coils in response to a measured quantity, the pointer can be angularly moved in response to the measured quantity.

By the way, in such a cross-coil instrument, it has been known that due to the winding diameter dimension difference and the magnetic hysteresis or the like of respective coils which are generated by winding a pair of coils in layers in a crossing manner, an error occurs on a rotating angle (an output angle) of the pointer in response to an input signal and this error appears as the indication error. To cope with this, as disclosed in Japanese Laid-open Patent Publication 27146/1994, it may be possible to propose an idea that a pointer shaft on which a pointer is fixedly mounted is provided independently from a rotor shaft on which a rotor magnet is fixedly mounted and both of these shafts are connected by way of gears so as to rotate the pointer shaft at a reduced speed compared with the rotor shaft whereby the occurrence of the indication error can be suppressed.

However, the cross-coil instrument disclosed in the above-mentioned publication has a drawback that in addition to the constitution that a pair of coils are wound around the housing in a laminated manner, gears are further stacked on the housing around which the coils are wound, the height dimension of the instrument becomes large so that the instrument has to become large-sized.

The present invention has been made in view of the above and it is a main object of the present invention to provide a coil instrument which can maintain a compact constitution even when a pointer-side rotary shaft is rotated at a reduced speed by way of gears.

DISCLOSURE OF THE INVENTION

The coil instrument according to the present invention comprises a rotor shaft having a rotor magnet and a first gear rotatable along with the rotor magnet, a pointer shaft having a second gear connected with the first gear, and a pair of coils arranged such that the coils oppositely face an outer peripheral surface of the rotor magnet where the second gear is not arranged and give a rotational force to the rotor magnet upon energization thereof. Due to such a constitution, even when the rotary shaft at the pointer side is subjected to the deceleration rotation by way of gears, the compact coil instrument can be provided.

Further, the coil instrument according to the present invention comprises a rotor shaft having a rotor magnet and a first gear rotatable along with the rotor magnet, a pointer shaft having a second gear connected with the first gear, a housing supporting the pointer shaft and the rotor shaft in parallel, and a pair of coils arranged such that the coils oppositely face an outer peripheral surface of the rotor magnet where the second gear is not arranged and give a rotational force to the rotor magnet upon energization thereof. Due to such a constitution, even when the rotary shaft at the pointer side is subjected to the deceleration rotation by way of gears, the compact coil instrument can be provided.

Further, the coil instrument according the present invention comprises a rotor shaft having a rotor magnet and a first gear rotatable along with the rotor magnet, a pointer shaft having a second gear connected with the first gear, and a pair of coils arranged such that the coils oppositely face an outer peripheral surface of the rotor magnet where the second gear is not arranged in a state that respective winding central axes of the coils cross each other with a given crossing angle at or in the vicinity of the rotary center of the rotor magnet and give a rotational force to the rotor magnet upon energization thereof. Due to such a constitution, even when the rotary shaft at the pointer side is subjected to the deceleration rotation by way of gears, the compact coil instrument can be provided.

Further, the coil instrument according to the present invention comprises a rotor shaft having a rotor magnet and a first gear rotatable along with the rotor magnet, a pointer shaft having a second gear connected with the first gear, a housing supporting the pointer shaft and the rotor shaft in parallel, and a pair of coils arranged such that the coils oppositely face an outer peripheral surface of the rotor magnet where the second gear is not arranged in a state that respective winding central axes of the coils cross each other with a given crossing angle at or in the vicinity of the rotary center of said rotor magnet and give a rotational force to the rotor magnet upon energization thereof. Due to such a constitution, even when the rotary shaft at the pointer side is subjected to the deceleration rotation by way of gears, the compact coil instrument can be provided.

Further, in the coil instrument according to the present invention, the crossing angle made by the winding center axes of respective coils is set to approximately 90 degrees. Due to such a constitution, the magnetic field vectors generated at respective coils cross at an approximately right angle and hence, magnetic forces of the coils can be made to effectively act on the rotor magnet.

Further, in the coil instrument according to the present invention, the crossing angle made by the winding center axes is set to less than 90 degrees. Due to such a constitution, the width dimension of the housing including the coils can be made small.

Further, in the coil instrument of the present invention, the rotary center of the rotor magnet is positioned closer to the coil side than the crossing point made by the winding central axes of the respective coils. Due to such a constitution, the width dimension of the housing including the coils can be made small.

Further, in the coil instrument of the present invention, the first gear is provided with first continuous teeth on an outer periphery thereof, the second gear includes a accommodating portion which accommodates the first gear on an outer periphery thereof, and second continuous teeth which are meshed with the first continuous teeth are formed on an inner periphery of the accommodating portion. Due to such a constitution, while realizing the deceleration rotation of the pointer shaft to the rotor shaft, the rotor shaft and the pointer shaft can be made to approach each other and hence, the width dimension of the coil instrument can be made small by an approaching quantity.

Further, in the coil instrument of the present invention, an outer diameter of the first gear is smaller than an outer diameter of the rotor magnet, an outer diameter of the second gear is larger than the outer diameter of the first gear, and the second gear is arranged such that the second gear overlaps the rotor magnet with a given distance therebetween. Due to such a constitution, it is unnecessary to interpose other gears between these respective gears and hence, the width dimension of the instrument can be made small.

Further, in the coil instrument of the present invention, a coil supporting portion which supports the respective coils is contiguously formed on the housing. Due to such a constitution, the directions of the winding center axes of the coils and the crossing angle made by both winding center axes can be surely determined and hence, the coils can be held in a stable manner in a state that the directions of the winding center axes of the coils and the crossing angle made by both winding center axes are surely determined.

Further, in the coil instrument of the present invention, the rotor magnet 1 and the first and second gears are accommodated in the housing. Due to such a constitution, the height dimension can be decreased.

Further, in the coil instrument of the present invention, the rotation regulation means which regulates the rotation of the pointer shaft is disposed between the housing and the second gear. Due to such a constitution, the pointer can be surely stopped at a given position (a start position).

Further, in the coil instrument of the present invention, a given region of the outer periphery of the housing excluding a region corresponding to the second gear is covered with a cup-shaped magnetic casing. Due to such a constitution, the magnetic case can be miniaturized and the cost can be reduced.

Further, in the coil instrument of the present invention, a fixed magnet which restricts the movement of the rotor magnet when the respective coils are not energized is provided to the housing. Due to such a constitution, the pointer can be surely held at a given position (a start position) when respective coils are not energized.

Further, in the coil instrument of the present invention, a biasing member which rotates the pointer shaft in one direction when the respective coils are not energized is provided to the pointer shaft. Due to such a constitution, the pointer can be surely returned to a given position (a start position) when respective coils are not energized and further the backlash between the first and second gears can be eliminated.

Further, the coil instrument according to the present invention comprises a rotor shaft having a rotor magnet and a first gear rotatable along with the rotor magnet, a pointer shaft disposed parallel with the rotor shaft and having a second gear connected with the first gear, and a pair of coils arranged at an outer peripheral portion in the radial direction of the rotor magnet where the second gear is not arranged and give a rotational force to the rotor magnet upon energization thereof, wherein the rotor magnet is partially covered with respective coils. Due to such a constitution, the coil instrument can increase the generating torque while maintaining the thin configuration thereof.

Further, the coil instrument according to the present invention comprises a rotor shaft having a rotor magnet and a first gear rotatable along with the rotor magnet, a pointer shaft having a second gear connected with the first gear, a housing supporting the pointer shaft and the rotor shaft in parallel, and a pair of coils arranged at an outer peripheral surface in the radial direction of the rotor magnet where the second gear is not arranged in a state that respective winding central axes of the coils cross each other with a given crossing angle at or in the vicinity of the rotary center of the rotor magnet and give a rotational force to the rotor magnet upon energization thereof, wherein the rotor magnet is partially covered with respective coils. Due to such a constitution, the coil instrument can increase the generating torque while maintaining the thin configuration thereof.

Further, in the coil instrument according to the present invention, the winding diameter of the coils corresponding to at least a radial peripheral surface of the rotor magnet is gradually increased toward the rotor shaft. Due to such a constitution, while ensuring an enough winding quantity, the coil instrument can make the structure compact whereby the space efficiency can be enhanced.

Further, in the coil instrument according to the present invention, the winding frame portions around which the respective coils are wound are contiguously formed on the housing. Due to such a constitution, the directions of the winding center axes of respective coils and the crossing angle made by both winding center axes can be surely determined and hence, the coils can be held in a stable manner in a state that the directions of the winding center axes of the coils and the crossing angle made by both winding center axes are surely determined.

BRIEF DESCRIPTION OF THE DRAWINGS

FIG. 1 and FIG. 2 are views showing a first embodiment of the present invention, wherein FIG. 1 is a plan view of a coil instrument and FIG. 2 is a cross-sectional view taken along a line A—A of FIG. 1.

FIG. 6 to FIG. 8 are views showing a fifth embodiment of the present invention, wherein FIG. 6 is a plan view of a coil instrument, FIG. 7 is a cross-sectional view taken along a line A—A of FIG. 6 and FIG. 8 is a cross-sectional view taken along a line B—B of FIG. 6.

DETAILED DESCRIPTION OF THE INVENTION

Figure 1:
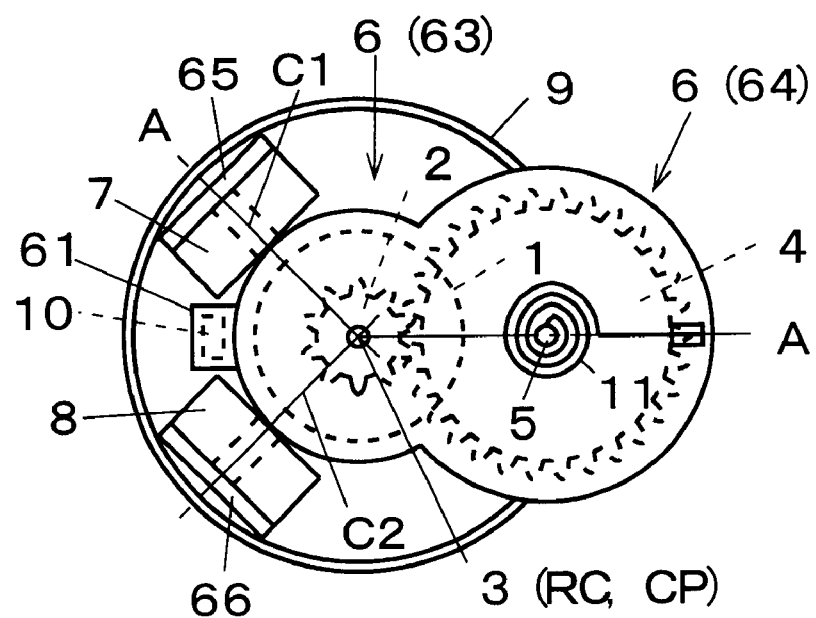
Figure 2:
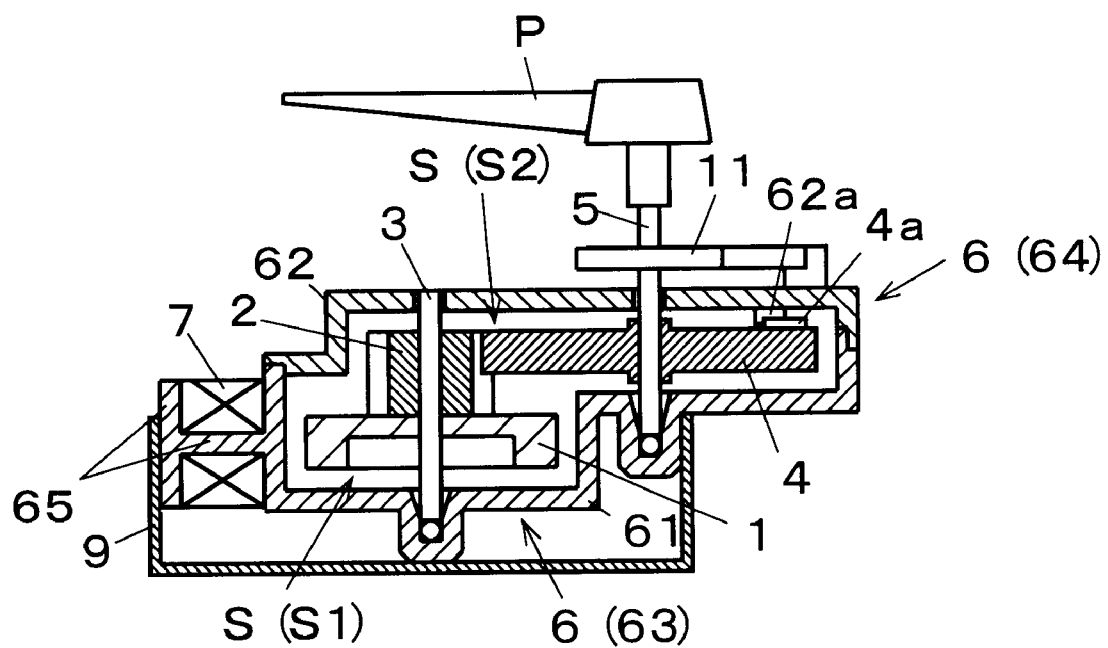

In FIG. 1 and FIG. 2 which show a first embodiment of the present invention, a coil instrument includes a rotor shaft 3 provided with a rotor magnet 1 and a first gear 2, a pointer shaft 5 provided with a second gear 4 which is connected by meshing with the first gear 2 and mounting a pointer P thereon, a housing 6 which pivotally supports the rotor shaft 3 and the pointer shaft 5 in parallel in a state that respective gears 2, 4 are connected and accommodates the rotor magnet 1 and the first and second gears 2, 4, a pair of coils 7, 8 which are positioned on an outer periphery of the housing 6 and are arranged at the side of the rotor magnet 1 in an opposed manner and give a rotational force to the rotor magnet 1 upon energization thereof, and a magnetic case 9 which covers a given region of the housing 6.

The rotor magnet 1 is made of, for example, a disc-like plastic magnet which is magnetized with two poles, that is, a N pole and a S pole. The first gear 2 is made of a gear having a desired number of continuous teeth on an outer periphery thereof. In FIG. 2, the first gear 2 is fixedly mounted on the rotor shaft 3 such that the rotor magnet 1 is positioned below and the first gear 2 is positioned above.

The second gear 4 has a diameter greater than a diameter of the first gear 2, has a larger number of continuous teeth than the first gear 2 and is fixedly mounted on the pointer shaft 5. In FIG. 2, the second gear 4 is extended toward the first gear 2 side and is meshed with the first gear 2 such that the second gear 4 is positioned above the rotor magnet 1 and overlaps the rotor magnet 1 with a suitable space therebetween.

The housing 6 is made of synthetic resin and, as shown in FIG. 2, the housing 6 is divided and formed into a first frame body 61 positioned below and a second frame body 62 positioned above. A cavity which becomes an accommodating portion S is formed between the first and second frame bodies 61, 62 and the rotor shaft 3 and the pointer shaft 5 are pivotally supported on the housing 6. The pointer shaft 5 has one end thereof protruded to the outside from the housing 6.

As shown in FIG. 2, the accommodating portion S is formed by a first housing portion 63 which forms a first accommodating portion S1 positioned below and accommodating the rotor magnet 1 and a second housing portion 64 which forms a second accommodating portion S2 positioned above and accommodating the first and second gears 2, 4. Respective accommodating portions S1, S2 formed by these housing portions 63, 64 are communicated with each other corresponding to the relationship between the rotor magnet 1 and the second gear 4 overlapped with the previously-mentioned space and the relationship between the first gear 1 and the second gear 4 connected with each other. Further, as shown in FIG. 1, respective housing portions 63, 64 have arcuate planar shapes corresponding to the outer-diameter shapes of the rotor magnet 1 and the second gear 4.

As shown in FIG. 1, the coils 7, 8 are arranged such that they opposedly face an outer peripheral side surface of the rotor magnet 1 (radial-directional outer peripheral portion of the rotor magnet 1), wherein at an outer peripheral region of the first housing portion 63 which is positioned at a side opposite to the second housing portion 64 which becomes the second gear 4 accommodating side, axial lines extending toward the rotor magnet 1 along respective winding center axes C1, C2 cross each other at the center of rotation RC (a crossing point CP) of the rotor magnet 1 and a crossing angle made by respective winding center axes C1, C2 in this state becomes approximately 90 degrees. Here, the coils 7, 8 are wound around a pair of coil support portions 65, 66 respectively extending from the outer peripheral surface of the first housing portion 63 (the first frame body 61) toward the outside in the radial direction of the rotor magnet 1 and are supported on the housing 6.

In this manner, although the magnetic case 9 having a cup shape is mounted on the housing 6 around which the coils 7, 8 are wound, according to this embodiment, a given region of the housing 6 excluding a region corresponding to the second gear 4, that is, only a bottom portion and its periphery of the first housing portion 63 which do not include the region corresponding to the second gear 4 are covered with the magnetic case 9.

In the coil instrument having such a constitution, by energizing respective coils 7, 8, magnetic field vectors respectively act along the winding center axes C1, C2 and the rotor magnet 1 (the rotor shaft 3) is rotated corresponding to the intensities of respective magnetic field vectors. This rotation is transmitted to the pointer shaft 5 by way of the first gear 2 and the second gear 4 and the pointer P fixedly mounted on the pointer shaft 5 performs the angular movement.

Here, the first gear 2 and the second gear 4 have set their respective gear ratio to 1:3, for example, such that the second gear 4 is rotated at a low speed (a reduced speed) compared to the first gear 2. Due to such a reduced-speed or a deceleration operation, the angular movement of the pointer P with the least indication error to the input signal can be obtained so that the linearity (linear characteristics) of the indication characteristics can be ensured whereby the highly accurate indication can be performed. Provided that the deceleration operation is performed at the pointer shaft 5 side, the gear ratio between the first and second gears 2, 4 can be set to any arbitrary value.

Further, a fixed-side contact portion 62a which has a portion thereof extended toward the second gear 4 in the second accommodating portion S2 and is formed on the housing 6 (here, the second frame body 62) and a movable-side contact portion 4a which has a portion thereof extended toward an inner wall surface of the second frame body 62 in the second accommodating portion S2 is formed on the second gear 4. The movable-side contact portion 4a and the fixed-side contact portion 62a constitute rotation regulating means which regulates the rotation of the pointer shaft 5. The position at which both contact portions 4a, 62a come into contact with each other is set as a start position of the pointer P (for example, a minimum indication position).

In this manner, by performing the regulation of rotation of the pointer P between the second gear 4 fixedly mounted on the pointer shaft 5 on which the pointer P is mounted and the housing 6, the irregularities of the stop position of the pointer P can be decreased compared with a case in which the regulation of the rotation is performed at the rotor shaft 3 side.

Here, the regulation of rotation of the pointer P may be performed to regulate not only the start position of the pointer P but also the maximum indication position. When the maximum indication position is regulated along with the start position regulation in this manner, for example, a movable-side contact portion (not shown in the drawing) separate from the movable-side contact portion 4a may be formed on the second gear 4.

Further, as shown in FIG. 1, a fixed magnet 10 is arranged on the housing 6 (here, the first frame body 61) at a position where the fixed magnet 10 faces the outer peripheral surface of the rotor magnet 1 in an opposed manner with a suitable space therebetween. Due to this fixed magnet 10, the movement of the rotor magnet 1 can be restricted when respective coils 7, 8 are not energized so that the pointer P can be maintained at the start position which becomes the position where the movable-side contact portion 4a and the fixed-side contact portion 62a come into contact with each other. Here, it is desirable that the fixed magnet 10 is mounted such that the rotor magnet 1 can bias the movable-side contact portion 4a toward the fixed-side contact portion 62a side.

The provision of such a fixed magnet 10 makes a magnetic force of the fixed magnet 10 always act on the rotor magnet 1 and hence becomes a factor which generates an indication error. However, as mentioned above, according to this embodiment, since the coil instrument is constituted such that the pointer shaft 5 is operated at a reduced speed (rotation) compared with the rotor shaft 3, it gives rise to an advantageous effect that even when the magnetic influence derived from the fixed magnet 10 is present, this magnetic influence hardly appears as the indication error.

Further, in the housing 6 (here, the second frame body 62), a biasing member 11 made of a hair spring which rotates the rotor magnet 1 in one direction (reduced speed indication direction side) when respective coils 7, 8 are not energized is mounted on a portion of the pointer shaft 5 protruded from the housing 6. Due to this biasing member 11, the pointer P can be returned to the start position even when respective coils 7, 8 are not energized and, at the same time, a backlash present between the first and second gears 2, 4 can be eliminated.

As has been described heretofore, according to this embodiment, the coil instrument includes the rotor shaft 3 provided with the rotor magnet 1 and the first gear 2 rotated together with the rotor magnet 1, the pointer shaft 5 provided with the second gear 4 connected with the first gear 2, the housing 6 which pivotally supports the rotor shaft 3 and the pointer shaft 5 in parallel and a pair of coils 7, 8 which give the rotational force to the rotor magnet 1. Further, respective coils 7, 8 are arranged such that they opposedly face the outer peripheral surface of the rotor magnet 1 where the second gear 4 is not arranged. Particularly, respective coils 7, 8 are arranged such that they opposedly face the outer peripheral surface of the rotor magnet 1 where their winding center axes C1, C2 cross at the center of rotation of the rotor magnet 1 while making the given crossing angle between them. Due to such a constitution, the coils 7, 8 are not stacked on the housing 6 so that even when the pointer shaft 5 is rotated at a reduced speed by way of gears, the height dimension of the instrument can be decreased whereby the coil instrument can be miniaturized. Further, setting the arrangement position of the coils 7, 8 at the outer peripheral surface of the rotor magnet 1 on which the second gear 4 is not arranged, the coils 7, 8 and the second gear 4 are not overlapped in the axial direction of the rotor shaft 3 and the pointer shaft 5 whereby the coil instrument can be made thin correspondingly.

Further, according to this embodiment, since the crossing angle made by the winding center axes C1, C2 of respective coils 7, 8 is set to approximately 90 degrees, the magnetic field vectors generated in the coils 7, 8 cross each other at an approximately right angle so that the magnetic forces generated by the coils 7, 8 can be made to act on the rotor magnet 1 more effectively.

Further, according to this embodiment, the outer diameter of the first gear 2 is set smaller than the outer diameter of the rotor magnet 1 and the outer diameter of the second gear 4 is set larger than the outer diameter of the first gear 2, and the second gear 4 is arranged such that the second gear 4 overlaps the rotor magnet 1 with a given distance therebetween so that it is unnecessary to provide other gears between respective gears 2, 4 whereby the width dimension of the instrument can be made small.

Further, according to this embodiment, by continuously forming the coil support portions 65, 66 which support respective coils 7, 8 on the housing 6, the directions of the winding center axes C1, C2 of the coils 7, 8 and the crossing angle made by these axes can be surely determined. Further, in the state that the directions of the winding center axes C1, C2 and the crossing angle are surely determined in such a manner, the coils 7, 8 can be held in a stable manner.

Further, according to this embodiment, since the rotor magnet 1 and the first and second gears 2, 4 are accommodated in the housing 6, the height dimension can be reduced.

Further, according to this embodiment, since the rotation regulating means consisting of the movable-side contact portion 4a and the fixed-side contact portion 62a which regulates the rotation of the pointer shaft 5 is disposed between the housing 6 and the second gear 4, the pointer P can be surely stopped at the given position (the start position).

Further, according to this embodiment, since the fixed magnet 10 which restricts the movement of the rotor magnet 1 when respective coils 7, 8 are not energized is mounted on the housing 6, the pointer P can be surely held at the given position (the start position) when respective coils 7, 8 are not energized.

Further, according to this embodiment, since the biasing member 11 made of the hair spring which rotates the rotor magnet 1 in one direction when respective coils 7, 8 are not energized is mounted on the pointer shaft 5, even when respective coils 7, 8 are not energized, it becomes possible to return the pointer P to the given position (start position). Further, the backlash between the first and second gears 2, 4 can be eliminated.

Further, according to this embodiment, since the given outer peripheral region of the housing 6 excluding the region corresponding to the second gear 4 is covered with the cupshaped magnetic case 9, the magnetic case 9 can be miniaturized and the manufacturing cost thereof can be reduced.

Figure 3:
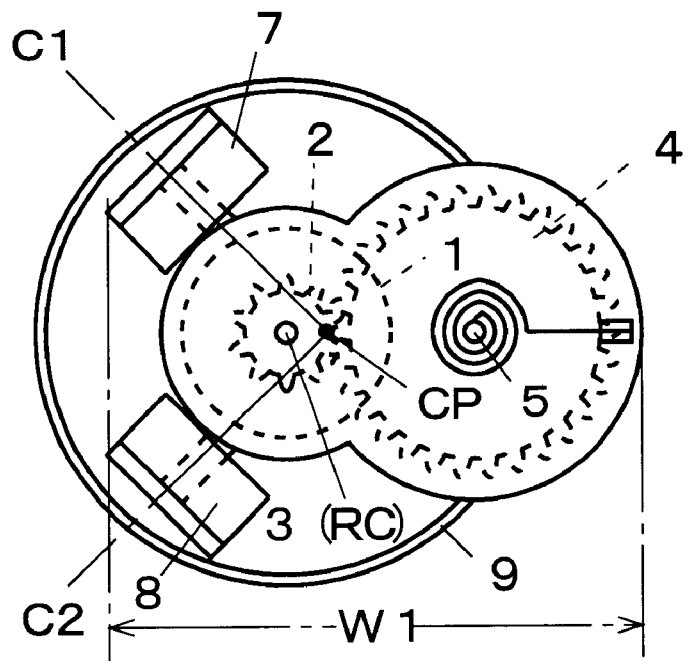
FIG. 3 is a plan view of a coil instrument showing a second embodiment of the present invention.

In this embodiment, the case in which the rotary center RC of the rotor magnet 1 and the crossing point CP of the winding center axes C1, C2 of respective coils 7, 8 agree with each other is exemplified. However, as the second embodiment of the present invention, as shown in FIG. 3, it may be possible to set the crossing point CP of the winding center axes C1, C2 of respective coils 7, 8 in the vicinity of the rotary center RC of the rotor magnet 1. Here, "in the vicinity of the rotary center RC" includes a center region of the rotor magnet 1 which can drive the rotor magnet 1 as an instrument at the time of setting the crossing point CP of respective coils 7, 8 in the inside of the rotor magnet 1.

Further, particularly, by setting the crossing point CP of the winding center axes C1, C2 of respective winding coils 7, 8 closer to the pointer shaft 5 side than the rotary center RC of the rotor magnet 1 (by setting the rotary center RC of the rotor magnet 1 closer to the coil 7, 8 side than the crossing point CP of the winding center axes C1, C2 of respective coils 7, 8), the width dimension W1 (see FIG. 3) of the housing 6 including the coils 7, 8 can be made small.

Figure 4:
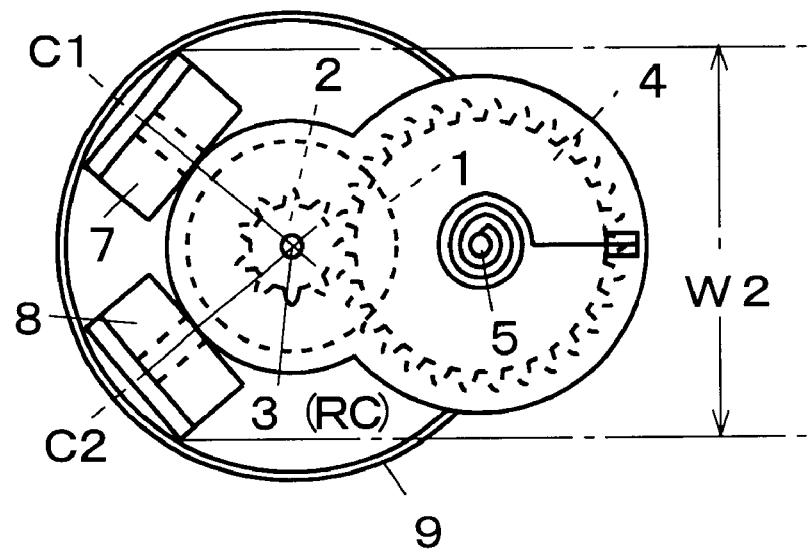
FIG. 4 is a plan view showing a third embodiment of the present invention.

Although the crossing angle made by the winding center axes C1, C2 of respective coils 7, 8 is set to approximately 90 degrees in the previously-mentioned first and second embodiments, as shown in FIG. 4, as a third embodiment of the present invention, it may be possible to set the crossing angle made by the winding center axes C1, C2 to a value smaller than 90 degrees (80 degrees in the drawing). By setting the crossing angle to a value smaller than 90 degrees in this manner, the width dimension W2 (see FIG. 4) of the housing 6 including the coils 7, 8 can be made small.

Figure 5:
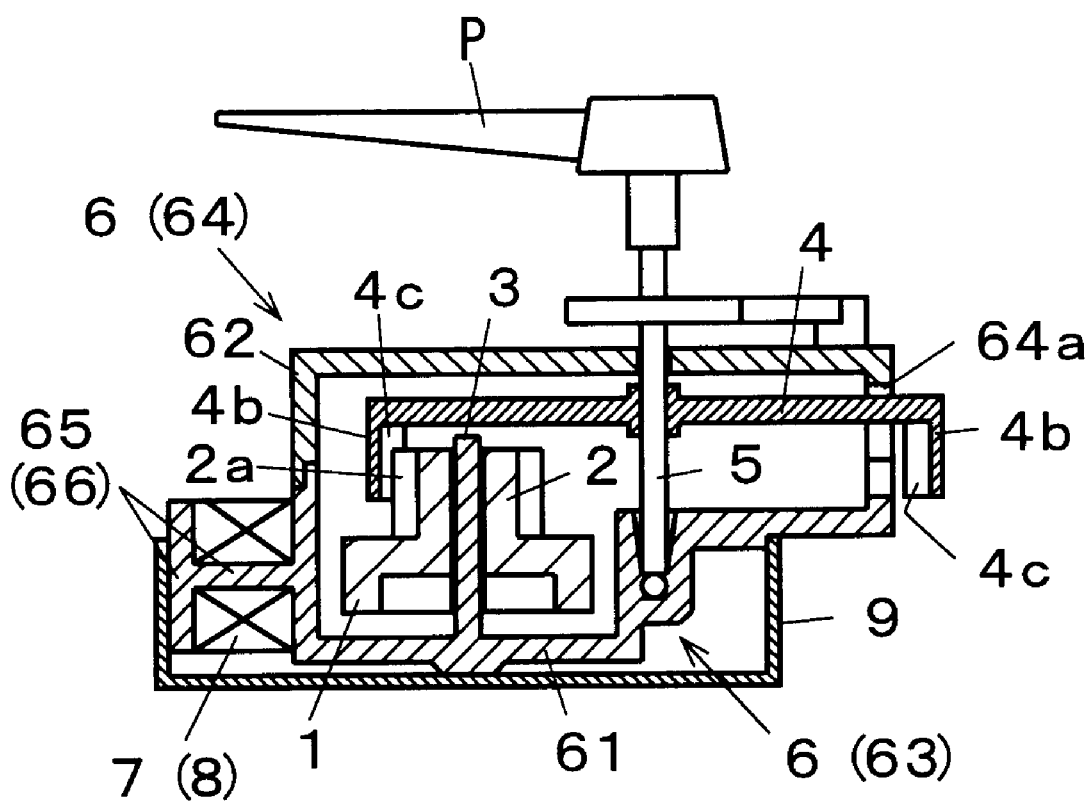
FIG. 5 is a cross-sectional view showing a fourth embodiment of the present invention.

The first to third embodiments have explained the case in which the first and second gears 2, 4 have their outer peripheries meshed with each other. However, as shown in FIG. 5, as a fourth embodiment of the present invention, first continuous teeth 2a may be formed on an outer periphery of the first gear 2, a gear accommodating portion 4b which accommodates the first gear 2 may be formed on the outer periphery of the second gear 4 and second continuous teeth 4c which are meshed with the first continuous teeth 2a may be formed on an inner periphery of this gear accommodating portion 4b. Due to such a constitution, while ensuring the deceleration rotation of the pointer shaft 5 compared to the rotor shaft 3, the rotor shaft 3 and the pointer shaft 5 can be made to approach each other so that the width dimension of the coil instrument can be reduced by an approaching quantity compared to the coil instruments of the first to fourth embodiments.

Further, the coil instrument according to a fourth embodiment of the present invention is provided with a notched portion 64a for partially exposing an end portion of the second gear 4 from the second housing portion 64 so that the width dimension of the coil instrument can be further decreased due to this notched portion 64a.

Further, in the coil instrument according to the fourth embodiment of this invention, the rotor shaft 3 is integrally formed with the first frame body 61 thus constituting a fixed shaft supported on the housing 6. A rotor magnet 1 and a first gear 2 which moves corresponding to the rotor magnet 1 are rotatably supported on this rotor shaft 3 which is constituted by a fixed shaft. In this case, the first gear 2 is integrally and contiguously formed with the rotor magnet 1 made of a plastic magnet, for example. In this manner, since the rotor shaft 3 is constituted by the fixed shaft which is integrally formed with the housing 6, the number of parts can be reduced.

Subsequently, a fifth embodiment of the present invention is explained.

Figure 6:
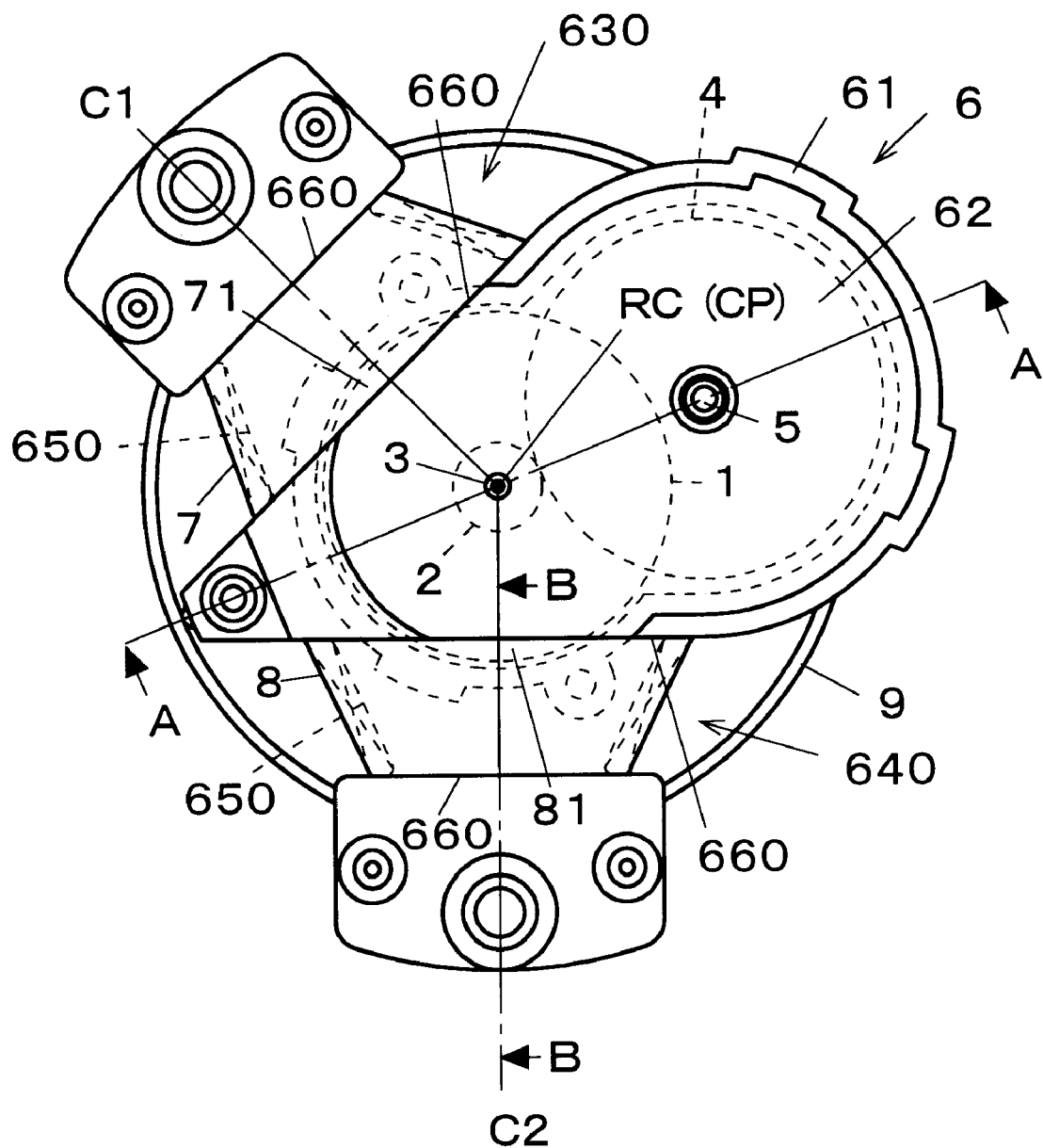
Figure 7:
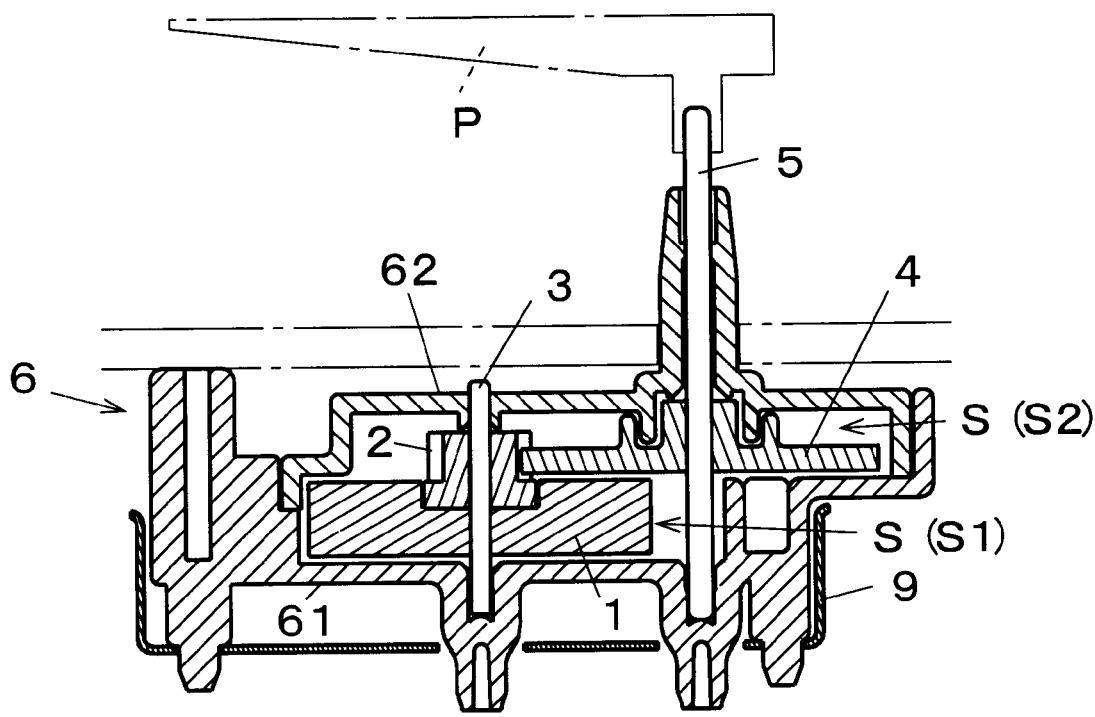
Figure 8:
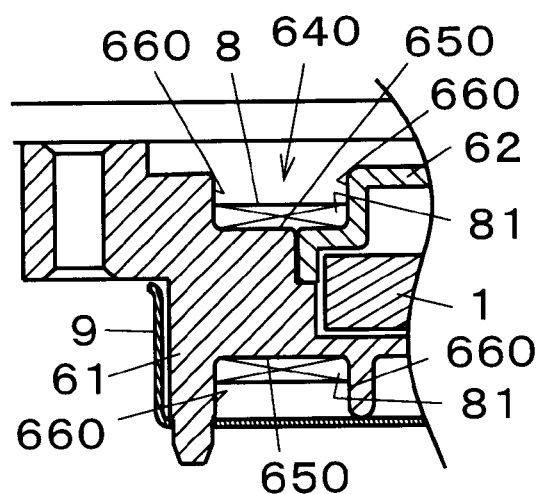

As shown in FIG. 6 to FIG. 8, a coil instrument includes a rotor shaft 3 provided with a rotor magnet 1 and a first gear 2, a pointer shaft 5 provided with second gear 4 which is connected by meshing with the first gear 2 and mounting a pointer P on a distal end thereof and rotating the pointer P corresponding to the rotation of the second gear 4, a housing 6 which pivotally supports the rotor shaft 3 and the pointer shaft 5 in parallel in a state that respective gears 2, 4 are connected and accommodates the rotor magnet 1 and the first and the second gears 2, 4, a pair of coils 7, 8 which are arranged on an outer periphery in the radial direction of the rotor magnet 1 and give a rotational force to the rotor magnet 1 upon energization thereof, and a magnetic case 9 made of metal which covers a given region of the housing 6.

The rotor magnet 1 is made of, for example, a disc-like plastic magnet which is magnetized with four poles such that an N pole and an S pole are alternately arranged. The first gear 2 is made of a gear having a desired number of continuous teeth on an outer periphery thereof. In FIG. 2, the rotor magnet 1 and the first gear 2 are fixedly mounted on the rotor shaft 3 such that the rotor magnet 1 is positioned below and the first gear 2 is positioned above.

The second gear 4 has a diameter greater than a diameter of the first gear 2, has a larger number of continuous teeth on an outer perphery thereof than the first gear 2 and is fixedly mounted on the pointer shaft 5. In FIG. 7, the second gear 4 is extended toward the first gear 2 side and is meshed with the first gear 2 such that the second gear 4 is positioned above the rotor magnet 1 and overlaps the rotor magnet 1 with a suitable space.

The housing 6 is made of synthetic resin and, as shown in FIG. 7, the housing 6 is divided and formed into a first frame body 61 positioned below and a second frame body 62 positioned above. A cavity which becomes an accommodating portion S is formed between the first and the second frame bodies 61, 62 and the rotor shaft 3 and the pointer shaft 5 are pivotally supported on the housing 6.

As shown in FIG. 7, the accommodating portion S is formed by a first accommodating portion S1 which is positioned below and accommodates the rotor magnet 1 and a second accommodating portion S2 which is positioned above and accommodates the first and second gears 2, 4. Respective accommodating portions S1, S2 are communicated with each other corresponding to the relationship between the rotor magnet 1 and the second gear 4 overlapped with a space therebetween and the relationship between the first gear 2 and the second gear 4 connected with each other.

Further, in this case, in the housing 6 region corresponding to the outer periphery in the radial direction of the rotor magnet 1 at which the second gear 4 is not arranged, winding frame portions 630, 640 are formed of first and second frame bodies 61, 62 and the coils 7, 8 are wound around these winding frame portions 630, 640.

As shown in FIG. 6 and FIG. 8, the winding frame portions 630, 640 respectively include winding portions 650 around which respective coils 7, 8 are wound and a pair of opposing walls 660 which sandwich this winding portion 650 such that both end portions of respective coils 7, 8 are held by these opposing walls 660. In this embodiment, the winding portion 650 is formed such that the contour thereof which corresponds to the peripheral surface in the radial direction of the rotor magnet 1 is gradually increased toward the rotor shaft 3.

By winding the coils 7, 8 around the winding frame portions 630, 640, the coils 7, 8 are positioned at the outer periphery (outer peripheral surface) in the radial direction of the rotor magnet 1 where the second gear 4 is not arranged, wherein the winding diameters corresponding to the radial peripheral surface of the rotor magnet 1 are gradually increased toward the rotor shaft 3. Here, axial lines extended toward the rotor shaft 3 side along the winding center axes C1, C2 of respective coils 7, 8 cross at the center of rotation RC of the rotor magnet 1 (crossing point CP). The crossing angle made by respective winding center axes C1, C2 here is set to approximately 135 degrees in this embodiment. Further, on the rotor magnet 1 sides of respective coils 7, 8, covering portions 71, 81 which partially cover the rotor magnet 1 are formed.

The covering portions 71, 81 partially cover the rotor magnet 1 such that the outer peripheral portion in the radial direction of the rotor magnet 1 is accommodated in the inside thereof.

In this manner, although a cup-shaped magnetic case 9 is mounted on the housing 6 around which coils 7, 8 are wound, in this embodiment, a desired region of the housing 6 excluding a region corresponding to the second gear 4, that is, only a bottom portion of the first housing portion 63 and its periphery which do not include the region corresponding the second gear 4 is covered with the magnetic case 9.

In the coil instrument having such a constitution, respective magnetic field vectors act along the winding center axes C1, C2 of the coils 7, 8 by energizing respective coils 7, 8. Corresponding to the intensities of these respective magnetic field vectors, the rotor magnet 1 magnetized with four poles (the rotor shaft 3) is rotated and the rotational force is transmitted to the pointer shaft 5 by way of the first gear 2 and the second gear 4 so that the pointer P fixedly mounted on the pointer shaft 5 performs the angular movement.

Here, respective gear ratios of the first gear 2 and the second gear 4 are determined to 1:5, for example, such that the second gear 4 is rotated at a low speed (deceleration) compared to the first gear 2. Due to this deceleration operation, the angular movement of the pointer P exhibiting a small indication error in response to an input signal can be realized so that the linearity (linear characteristics) of the indication characteristics can be ensured whereby the highly accurate indication can be performed. So long as the deceleration operation can be performed at the pointer shaft 5 side, the gear ratios of the first and second gear 2, 4 can be arbitrarily determined.

As has been described above, according to this embodiment, the rotor shaft 3 which holds the rotor magnet 1 and the first gear 2 which is rotated together with this rotor magnet 1 is provided. The pointer shaft 5 which holds the second gear 4 being connected with and driven by the first gear 2 and drives the pointer P corresponding to the rotation of this second gear 4 is provided. The housing 6 which supports these pointer shaft 5 and the rotor shaft 3 in parallel is provided. A pair of coils 7, 8 which are arranged such that respective winding center axes C1, C2 cross each other with the crossing angle of approximately 45 degrees at the rotary center CR of the rotor magnet 3 and give the rotational force to the rotor magnet 1 by energization are mounted on the outer periphery in the radial direction of the rotor magnet 1 where the second gear 4 is not arranged. Further, respective coils 7, 8 are provided with the covering portions 71, 81 which partially cover the outer peripheral portion in the radial direction of the rotor magnet 1. Due to such a constitution, while maintaining the thin structure by arranging the coils 7, 8 at the outer peripheral portion in the radial direction of the rotor magnet 1, the magnetic field acting on the rotor magnet 1 at the covering portions 71, 81 of the coils 7, 8 can be increased so that the output torque of the rotor can be increased. Further, since the number of coils 7, 8 necessary in operation can be minimized, the coil instrument can be constituted by the number of the coils 7, 8 smaller than conventional coil instrument so that the dimension of the configuration can be reduced and the manufacturing cost can be also reduced.

Further, in this embodiment, since respective coils 7, 8 are wound such that the winding diameter corresponding to the at least radial peripheral surface of the rotor magnet is gradually increased toward the rotor shaft 3, while ensuring a sufficient winding quantity, the dimension of the configuration of the coils 7, 8 can be reduced so that the space efficiency can be enhanced.

Further, according to this embodiment, the winding frame portions 63, 64 are contiguously formed on the housing 6 which supports both of the rotor shaft 3 and the pointer shaft 5 and respective coils 7, 8 are wound around these winding frame portions 63, 64 and hence, the directions of the winding center axes C1, C2 of respective coils 7, 8 and the crossing angle made by these winding center axes C1, C2 can be surely determined. Further, the coils can be held in a stable manner in the state that the directions of these winding center axes and the crossing angle can be surely determined.

Although the rotor magnet 1 magnetized with four poles constituted by alternating an N pole and an S pole is used and the crossing angle made by the winding center axes C1, C2 of respective coils 7, 8 is set to approximately 135 degrees in this embodiment, the number of energization of the rotor magnet 1 and the crossing angle made by the winding center axes C1, C2 can be arbitrarily determined. For example, the number of magnetization of the rotor magnet 1 may be set to six poles and the crossing angle made by the winding center axes C1, C2 of respective coils 7, 8 may be set to approximately 150 degrees.

Further, according to this embodiment, the outer diameter of the first gear 2 is set smaller than the outer diameter of the rotor magnet 1, the outer diameter of the second gear 4 is set larger than the outer diameter of the first gear 2, and the second gear 4 is arranged such that the second gear 4 overlaps the rotor magnet 1 with a given distance therebetween and hence, it is unnecessary to interpose other gears between respective gears 2, 4 whereby the width dimension of the instrument can be made small.

Further, according to this embodiment, a case in which the rotary center RC of the rotor magnet 1 agrees with the crossing pointer CP of the winding center axes C1, C2 of respective coils 7, 8 is exemplified. However, the crossing point CP of the winding center axes C1, C2 of respective coils 7, 8 may be set in the vicinity of the rotary center RC of the rotor magnet 1. Here, "in the vicinity of the rotary center RC" includes a central region of the rotor magnet 1 which can drive the rotor magnet 1 as an instrument at the time of setting the crossing point CP of respective coils 7, 8 within the rotor magnet 1.

Industrial Applicability

The application of the present invention is not limited to a combination meter for a vehicle and the present invention is widely applicable as drive sources of various meters mounted on ships and airplanes, for example.

What is claimed is:

1. A coil instrument comprising a rotor shaft having a rotor magnet and a first gear rotatable along with said rotor magnet, a pointer shaft disposed parallel with said rotor shaft and having a second gear connected with said first gear, and a pair of coils disposed in a non-overlapping arrangement relative to one another, said pair of coils disposed radially adjacent said rotor magnet and facing a radial peripheral surface of said rotor magnet on a side of said rotor magnet opposite said second gear so as to be non-overlapping with said second gear and give a rotational force to said rotor magnet upon energization thereof.

2. A coil instrument according to claim 1 wherein an outer diameter of said first gear is smaller than an outer diameter of said rotor magnet, an outer diameter of said second gear is larger than the outer diameter of said first gear, and said second gear is arranged such that said second gear overlaps said rotor magnet with a given distance therebetween.

3. A coil instrument according to claim 1 wherein said rotor magnet and said first and second gears are accommodated in said housing.

4. A coil instrument according to claim 1 wherein a fixed magnet which restricts the movement of said rotor magnet when said respective coils are not energized is provided.

5. A coil instrument according to claim 1 wherein a biasing member which rotates said pointer shaft in one direction when said respective coils are not energized is provided.

6. A coil instrument comprising a rotor shaft having a rotor magnet and a first gear rotatable along with said rotor magnet, a pointer shaft having a second gear connected with said first gear, a housing supporting said pointer shaft and said rotor shaft in parallel, and a pair of coils disposed in a non-overlapping arrangement relative to one another, said pair of coils disposed radially adjacent said rotor magnet and facing a radial peripheral surface of said rotor magnet on a side of said rotor magnet opposite said second gear so as to be non-overlapping with said second gear and so as to give a rotational force to said rotor magnet upon energization thereof.

7. A coil instrument according to claim 6 wherein a coil supporting portion which supports said respective coils is contiguouly formed on said housing.

8. A coil instrument according to claim 6 wherein rotation regulation means which regulates the rotation of said pointer is disposed between said housing and said second gear.

9. A coil instrument according to claim 6 wherein a given region of said housing excluding a region corresponding said second gear is covered with a cup-shaped magnetic casing.

10. A coil instrument comprising a rotor shaft having a rotor magnet and a first gear rotatable along with said rotor magnet, a pointer shaft disposed parallel with said rotor shaft and having a second gear connected with said first gear, and a pair of coils disposed in a non-overlapping arrangement relative to one another, said pair of coils disposed radially adjacent said rotor magnet and facing a radial peripheral surface of said rotor magnet on a side of said rotor magnet opposite said second gear so as to be non-overlapping with said second gear in a state that respective winding central axes of said coils cross each other with a given crossing angle at or in the vicinity of the rotary center of said rotor magnet and so as to give a rotational force to said rotor magnet upon energization thereof.

11. A coil instrument according to claim 10 wherein said crossing angle is set at approximately 90 degrees.

12. A coil instrument according to claim 10 wherein said crossing angle is less than 90 degrees.

13. A coil instrument according to claim 10 wherein the rotary center of said rotor magnet is positioned closer to said coil side than the crossing point of said winding central axes of said respective coils.

14. A coil instrument comprising a rotor shaft having a rotor magnet and a first gear rotatable along with said rotor magnet, a pointer shaft having a second gear connected with said first gear, a housing supporting said pointer shaft and said rotor shaft in parallel, and a pair of coils disposed in a non-overlapping arrangement relative to one another, said pair of coils disposed radially adjacent said rotor magnet and facing a radial peripheral surface of said rotor magnet on a side of said rotor magnet opposite said second gear so as to be non-overlapping with said second gear in a state that respective winding central axes of said coils cross each other with a given crossing angle at or in the vicinity of the rotary center of said rotor magnet and so as to give a rotational force to said rotor magnet upon energization thereof.

15. A coil instrument comprising a rotor shaft having a rotor magnet and a first gear rotatable along with said rotor magnet, a pointer shaft disposed parallel with said rotor shaft and having a second gear connected with said first gear, and a pair of coils arranged such that said coils oppesdly face an outer peripheral surface of said rotor magnet where said second gear is not arranged and give a rotational force to said rotor magnet upon energization thereof, wherein said first gear is provided with first continuous teeth on an outer periphery thereof, said second gear includes an accommodating portion which accommodates said first gear on an outer periphery thereof, and second continuous teeth which are meshed with said first continuous teeth are formed on an inner periphery of said accommodating portion.

16. A coil instrument comprising a rotor shaft having a rotor magnet and a first gear rotatable along with said rotor magnet, a pointer shaft disposed parallel with said rotor shaft and having a second gear connected with said first gear, and a pair of coils disposed in a non-overlapping arrangement relative to one another, said pair of coils being arranged at an outer peripheral portion in the radial direction of said rotor magnet distal from said second gear so as to be non-overlapping with said second gear and so as to give a rotational force to said rotor magnet upon energization thereof, wherein said rotor magnet is partially covered with said respective coils.

17. A coil instrument according to claim 16 wherein said coils are wound such that the winding diameter corresponding to at least a radial peripheral surface of said rotor magnet is gradually increased toward said rotor shaft.

18. A coil instrument comprising a rotor shaft having a rotor magnet and a first gear rotatable along with said rotor magnet, a pointer shaft having a second gear connected with said first gear, a housing supporting said pointer shaft and said rotor shaft in parallel, and a pair of coils disposed in a non-overlapping arrangement relative to one another, said pair of coils being arranged at an outer peripheral portion in the radial direction of said rotor magnet distal from said second gear so as to be non-overlapping with said second gear in a state that respective winding central axes of said coils cross each other with a given crossing angle at or in the vicinity of the rotary center of said rotor magnet and so as to give a rotational force to said rotor magnet upon energization thereof, wherein said rotor magnet is partially covered with said respective coils.

19. A coil instrument according to claim 18 wherein winding frame portions around which said respective coils are wound are contiguously formed on said housing.

* * * * *